US011355644B2

(12) United States Patent
Song et al.

(10) Patent No.: US 11,355,644 B2
(45) Date of Patent: Jun. 7, 2022

(54) VERTICAL FIELD EFFECT TRANSISTORS WITH SELF ALIGNED CONTACTS

(71) Applicant: INTERNATIONAL BUSINESS MACHINES CORPORATION, Armonk, NY (US)

(72) Inventors: Yi Song, Albany, NY (US); Juntao Li, Cohoes, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 16/141,315

(22) Filed: Sep. 25, 2018

(65) Prior Publication Data

US 2020/0098929 A1 Mar. 26, 2020

(51) Int. Cl.
| | |
|---|---|
| *H01L 29/786* | (2006.01) |
| *H01L 29/06* | (2006.01) |
| *H01L 29/423* | (2006.01) |
| *H01L 29/51* | (2006.01) |
| *H01L 29/66* | (2006.01) |
| *H01L 21/308* | (2006.01) |
| *H01L 21/762* | (2006.01) |
| *H01L 21/768* | (2006.01) |

(52) U.S. Cl.
CPC ...... *H01L 29/78642* (2013.01); *H01L 21/308* (2013.01); *H01L 21/76224* (2013.01); *H01L 21/76897* (2013.01); *H01L 29/0649* (2013.01); *H01L 29/42392* (2013.01); *H01L 29/518* (2013.01); *H01L 29/6656* (2013.01); *H01L 29/66742* (2013.01)

(58) Field of Classification Search
CPC ......... H01L 29/78642; H01L 29/42392; H01L 29/0649
USPC ......................................... 257/329, E29.262
See application file for complete search history.

(56) References Cited

U.S. PATENT DOCUMENTS

| | | | |
|---|---|---|---|
| 9,245,885 | B1 | 1/2016 | Xie et al. |
| 9,312,383 | B1 | 4/2016 | Cheng et al. |
| 9,530,866 | B1 | 12/2016 | Zhang et al. |
| 9,548,385 | B1 | 1/2017 | Cheng et al. |
| 9,761,491 | B1 | 9/2017 | Huang et al. |
| 9,761,728 | B1 | 9/2017 | Cheng et al. |
| 9,805,935 | B2 | 10/2017 | Anderson et al. |
| 2017/0243921 | A1 | 8/2017 | Liu et al. |

(Continued)

OTHER PUBLICATIONS

Disclosed Anonymously, "Vertical Double Gate Transistors for Multi-Vt FinFET Applications" IP.com (May 7, 2012) IP.com No. IPCOM000217322D, pp. 1-6.

*Primary Examiner* — Nduka E Ojeh
(74) *Attorney, Agent, or Firm* — Tutunjian & Bitetto, P.C.; Samuel Waldbaum (57) ABSTRACT

A method of forming a semiconductor device is provided that includes forming a first source/drain region in a supporting substrate abutting a fin structure; and forming an isolation region in the supporting substrate adjacent to a first side of the fin structure, wherein the first source/drain region is positioned on an opposing second side of the fin structure. A gate structure is formed on the channel region portion of the fin structure. In a following step, a second source/drain region on an upper surface of the fin structure. Contacts can be formed aligned to the first source/drain region and the gate structure.

8 Claims, 7 Drawing Sheets

(56) References Cited

U.S. PATENT DOCUMENTS

| | | |
|---|---|---|
| 2018/0090593 A1 | 3/2018 | Cheng et al. |
| 2018/0090598 A1 | 3/2018 | Xie et al. |
| 2018/0097065 A1* | 4/2018 | Zhu .................... H01L 29/7827 |
| 2018/0261596 A1* | 9/2018 | Jun .................... H01L 27/0886 |
| 2022/0045164 A1* | 2/2022 | Hong ................. H01L 29/7827 |

* cited by examiner

VERTICAL FIELD EFFECT TRANSISTORS WITH SELF ALIGNED CONTACTS

BACKGROUND

Technical Field

The present disclosure relates to semiconductor devices, and more particularly to vertical transistors.

Description of the Related Art

Modern integrated circuits are made up of literally millions of active devices such as transistors and memory devices. The geometry of vertical transistors is attractive due to their potential density with increased scaling requirements. Further vertical transistors can allow for relaxed gate lengths to better control electrostatics.

SUMMARY

In one embodiment, the methods and structures that are described herein provide a vertical field effect transistor (VFET) that includes contacts that are aligned to the gate structure, first source/drain region (lower source/drain region), and second source drain region without shorting. In one embodiment, a semiconductor device is provided that includes a fin structure atop a supporting substrate, and a first source/drain region present on a portion of the supporting substrate on a first side of the fin structure. The first source/drain region abuts a lower portion of the fin structure. The semiconductor device may further include an isolation region present on a second side of the fin structure, the isolation region also abutting a lower portion of the fin structure. A gate structure is present abutting a channel region of the fin structure. The gate structure is atop the isolation region on the second side of the fin structure. A second source/drain region on an upper surface of the fin structure. In some embodiments, a sidewall spacer is present on a stack of the gate structure abutting the channel region of the fin structure, the second source/drain region on the upper surface of the fin structure, and the dielectric cap present on the second source/drain region, wherein the sidewall spacer is comprised of a low-k dielectric material selected from the group consisting of SiBCN, SiOCN, and combinations thereof. The sidewall spacer can facilitate the alignment of the contacts to the first source/drain region and the gate structure in a manner that does not short the device.

In another embodiment, a semiconductor device is provided that includes a fin structure atop a supporting substrate; and a first source/drain region present on a portion of the supporting substrate on a first side of the fin structure, in which the first source/drain region abutting a lower portion of the fin structure. An isolation region may be present on a second side of the fin structure. The isolation region abutting a lower portion of the fin structure. An inner sidewall of the isolation region is substantially aligned with a sidewall of the fin structure on the second side of the fin structure. The semiconductor device may further include a gate structure abutting a channel region of the fin structure. The gate structure can be present atop the isolation region on the second side of the fin structure. A second source/drain region on an upper surface of the fin structure. In some embodiments, a sidewall spacer is present on a stack of the gate structure abutting the channel region of the fin structure, the second source/drain region on the upper surface of the fin structure, and the dielectric cap present on the second source/drain region, wherein the sidewall spacer is comprised of a low-k dielectric material selected from the group consisting of SiBCN, SiOCN, and combinations thereof. The sidewall spacer can facilitate the alignment of the contacts to the first source/drain region and the gate structure in a manner that does not short the device.

In some embodiments, a method of forming a semiconductor device is provided that includes forming a first source/drain region in a supporting substrate abutting a fin structure; and forming an isolation region in the supporting substrate adjacent to a first side of the fin structure. The first source/drain region is positioned on an opposing second side of the fin structure. A gate structure can be formed on a channel region portion of the fin structure, the gate structure separated from the isolation region and the first source/drain region by at least one dielectric isolating spacer. The method may further include forming a second source/drain region on an upper surface of the fin structure.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The methods and structures described herein provide a vertical transistor, such as a vertical field effect transistor. As used herein a "field effect transistor" is a transistor in which output current, i.e., source-drain current, is controlled by the voltage applied to the gate. A field effect transistor has three terminals, i.e., gate, source and drain. A "gate structure" means a structure used to control output current (i.e., flow of carriers in the channel) of a semiconducting device through electrical fields. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel. Because the source region and the drain region are both provided by doped regions on opposing sides of the channel of the device, and their function as a source region or a drain region is impacted by the bias applied to these regions in the final device structure, the term "source/drain region" is suitable for describing these doped regions in the absence of the bias that designates their type.

The field effect transistors of the present disclosure have a vertically orientated channel region that can be present within a fin structure. As used herein, a "fin structure" refers to a semiconductor material, which is employed as the body of a semiconductor device, in which the gate structure is positioned around the fin structure such that charge flows down the channel of the fin structure As used herein, the term "channel" is the region adjacent to the gate structure and between the source and drain of a semiconductor device that becomes conductive when the semiconductor device is turned on. The source and drain regions of the fin structure are the portions of the fin structure that are on opposing sides of the channel region of the fin structure.

A "vertical" FET (VFET) semiconductor device has the drain, channel (e.g., fin channel), and source device components arranged perpendicular to the plane of the substrate surface, which is referred to as a vertical stack. A vertical FET (VFET) includes three contacts, which can include the top source/drain contact (CA), the bottom source/drain contact (TS) and the gate contact (CB). In most instances, the bottom source/drain contact (TS) and the gate contact (CB) are to be spaced from one another to avoid shorting to the gate structure, e.g., shorting the bottom source/drain contact (TS) to the gate structure. In most instances, the top source/drain contact (CA) and the bottom source/drain contact (TS) are to be spaced from one another to avoid shorting to the top source/drain to the bottom source/drain.

The spacing between these different contacts is far away to guarantee high yield in non-self-aligned method. However, in some embodiments, it is not necessary to place the contacts as close as possible to scale the overall size of the device and improve performance by reducing parasitic resistance.

The methods and structures of the present disclosure provide a highly scalable design while maintaining yield, i.e., not increasing the incidence of shorting between the different contacts to the first source/drain region, the second source/drain region and the gate contact. In some embodiments, the vertical field effect transistor (VFET) includes an isolation region, i.e., shallow trench isolation (STI) region, which is self-aligned with the fin structure including the channel region of the device. The gate contact (CB) overlies the self-aligned isolation region. Therefore, both the gate structure to bottom source/drain (first source/drain) overlap capacitance and the gate extension resistance are minimized. In some embodiments, the gate contact (CB) and bottom source/drain contact (TS) (first source/drain contact) are self-aligned to a dielectric cap, e.g., nitride containing cap, that is formed on the top of the top source/drain region (second source/drain region). This design feature provides for improved VFET density for a given footprint. In some embodiments, the methods and VFET structures described herein including low-k sidewall spacers, e.g., sidewall spacers composed of silicon boron carbon nitride (SiBCN) or silicon oxygen carbon nitride (SiOCN), which reduce parasitic capacitance between either of the bottom source/drain contact (first source/drain contact) (TS) and the gate structure contact (CB) and the top source/drain region (second source/drain region). Further, the sidewall spacer composed of the low-k dielectric material and the dielectric cap atop the top source/drain region (second source/drain region) prevents shorting between the gate contact (CB) and the top source/drain contact (second source/drain contact) (CA).

Further, the sidewall spacer composed of the low-k dielectric material and the dielectric cap atop the top source/drain region (second source/drain region) prevents shorting between the bottom source/drain contact (first source/drain contact) (TS) and the top source/drain contact (second source/drain contact) (CA). Some embodiments of structures disclosed herein, are now described in more detail with reference to FIGS. 1-12. In each of the supplied figures, the cross-section is taken parallel to the length of the fin structure.

Figure 1:
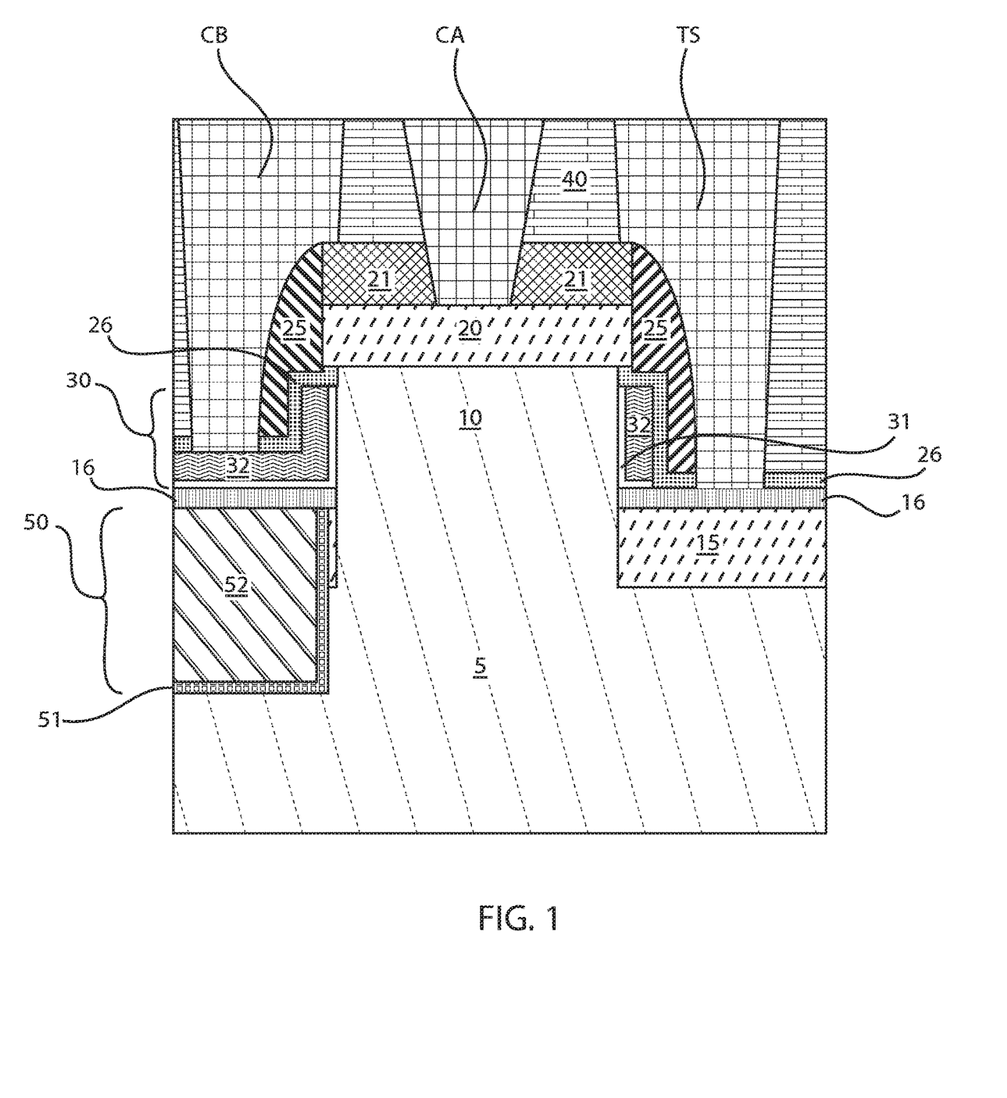
FIG. 1 is a side cross-sectional view of a vertical semiconductor device including an isolation region self-aligned to the fin structure, self-aligned gate contacts and bottom source/drain contacts, and a low-k sidewall spacer.

FIG. 1 depicts one embodiment of a vertical semiconductor device 100 including an isolation region 50 self-aligned to the fin structure 10, self-aligned gate structure contacts (CB) and bottom source/drain contacts (first source/drain contacts) TS, and a low-k sidewall spacer 25. In one embodiment, the semiconductor device 100 includes a fin structure 10 atop a supporting substrate 5.

The supporting substrate 5 can be provided by a bulk semiconductor substrate. The bulk semiconductor substrate may be composed of a type IV semiconductor. Examples of type IV semiconductors that are suitable for use as the base material for the supporting substrate 5 (as well as the fin structure 10 that is formed therefrom) may include silicon (Si), crystalline silicon (c-Si), monocrystalline silicon, germanium, silicon germanium (SiGe), silicon doped with carbon (Si:C), silicon germanium doped with carbon (SiGe:C) and a combination thereof, and similar semiconductors, e.g., semiconductor materials including at least one element from Group IVA (i.e., Group 14) of the Periodic Table of Elements. In other examples, the supporting substrate 5 may be composed of a type III-V semiconductor material. Examples of type III-V materials can include gallium arsenic (GaAs). Although the supporting substrate 5 is depicted as a bulk substrate, in other embodiments, the supporting substrate 5 may be a semiconductor on insulator (SOI) substrate.

The fin structure 10 is formed from the supporting substrate 5, and therefore may be composed of any of the aforementioned semiconductor materials, such as type IV semiconductor materials, e.g., silicon (Si), and/or type III-V semiconductor materials, e.g., gallium arsenics (GaAs), that are described above for the supporting substrate 5. The fin structure 10 may have a height ranging from 5 nm to 200 nm. In another embodiment, the fin structure 10 has a first height ranging from 10 nm to 100 nm. The fin structure 10 may have a width ranging from 5 nm to 20 nm. In another embodiment, the fin structure 10 has a width ranging from 5 nm to 15 nm.

Still referring to FIG. 1, a first source/drain region 15 is present on a portion of the supporting substrate 5 on a first side of the fin structure 10. The positioning of the first/source drain region 15 is laterally offset from the fin structure 10, as illustrated by its positioning to the side of the fin structure 10, and abutting the sidewall of the fin structure 10. More specifically, in some embodiments, the first source/drain region is abutting a lower portion, i.e., less than half the height (typically less than a ¼ of the height), of the fin structure 10. The lateral offset of the positioning of the first source/drain region 15 from the later described second source/drain region 20 and the gate structure 30 is one design aspect that reduces the incidence of shorting between the contacts that are subsequently formed to these regions, i.e., the gate contact (CB), the first source/drain contact (bottom source/drain contact) (TS) and the second source/drain contact (top source/drain contact) (CA).

The first source/drain 15 is composed of an epitaxially formed semiconductor material, which may have a type IV semiconductor base composition. The term "epitaxial material" denotes a material that is formed using epitaxial growth. The terms "epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Examples of type IV semiconductors that are suitable for use as the base material for the first source/drain 15 may include silicon (Si), crystalline silicon (c-Si), monocrystalline silicon, germanium, silicon germanium (SiGe), silicon doped with carbon (Si:C), silicon germanium doped with carbon (SiGe:C) and a combination thereof, and similar semiconductors, e.g., semiconductor materials including at least one element from Group IVA (i.e., Group 14) of the Periodic Table of Elements. In other examples, the first source/drain 15 may be composed of a type III-V semiconductor material. Examples of type III-V materials can include gallium arsenic (GaAs).

The base semiconductor material of the first source/drain 15 may doped to provide a conductivity type, which provides the conductivity type of the vertical FET 100. The term "conductivity type" denotes whether the devices which the region have a p-type conductivity or an n-type conductivity. For example, if the first source/drain region 15 is doped to an n-type conductivity, the VFET is an n-type VFET. For example, if the first source/drain region 15 is doped to a p-type conductivity, the VFET is a p-type VFET. As used herein, "P-type" refers to the addition of impurities to an intrinsic semiconductor that creates deficiencies of valence electrons, such as the addition of boron, aluminum, or gallium to a type IV semiconductor, such as silicon. As used herein, "N-type" refers to the addition of impurities to an intrinsic semiconductor that contribute free electrons, such as the addition of antimony, arsenic, or phosphorous to a type IV semiconductor, such as silicon.

Referring to FIG. 1, an isolation region 50 present on a second side of the fin structure 10, which is opposite the side of the fin structure 10 that the first source/drain region 15 is present on. In one embodiment, the isolation region 50 is a shallow trench isolation region (STI) that extends into the supporting substrate and includes a conformal dielectric liner layer 51, and a dielectric fill 52. The term "conformal" denotes a layer having a thickness that does not deviate from greater than or less than 30% of an average value for the thickness of the layer. The conformal dielectric liner layer 51 may be present on the sidewalls and the base of the trench formed into the supporting substrate 5 that contains the isolation region 50. The conformal dielectric liner layer 51 may be composed of a nitride containing dielectric, such as silicon nitride and/or silicon oxynitride. In one embodiment, the conformal dielectric liner layer 51 may have a thickness of 1 nm to 5 nm, however this example is not intended to be limiting, as other thicknesses have also been contemplated. The dielectric fill 52 may be composed of an oxide containing dielectric, such as silicon oxide ($SiO_2$). In one example, the dielectric fill 52 that is present in the trench may be high-density plasma oxide.

The upper surface of the isolation region 50 may be coplanar with the upper surface of a remaining portion of the epitaxial material that provides the first source/drain region 15 that is present on the second side of the fin structure 10. The upper surface of the isolation region 50, i.e., the upper surfaces of the dielectric fill 52 and the conformal dielectric liner layer 51, may be coplanar with the upper surface the first source/drain region 15 that is present on the first side of the fin structure 10. The isolation region 50 abuts a lower portion of the fin structure 10, wherein an inner sidewall of the isolation region 50 is substantially aligned with a sidewall of the fin structure 10 on said second side of the fin structure 10.

In some embodiments, the isolation region 50, i.e., shallow trench isolation (STI) region, is self-aligned with the fin structure 10 including the channel region of the device. The gate contact (CB) overlies the self-aligned isolation region 50. Therefore, both the gate structure 30 to bottom source/drain (first source/drain 15) overlap capacitance and the gate extension resistance are minimized.

Referring to FIG. 1, a bottom spacer 16 (hereafter referred to as at least one dielectric isolating spacer 16) may be present atop the isolation region 50 and the first source/drain region 15. The at least one dielectric isolating spacer 16 separates the isolation region 50 and the first source/drain region from the subsequently formed gate structure 30. The at least one bottom spacer 16 may be composed may be composed of an oxide, such as silicon oxide, nitride, such as silicon nitride or a combination thereof. The thickness of the at least one dielectric isolating spacer 16 may range from 5 nm to 30 nm.

In some embodiments, a gate structure 30 is positioned abutting a channel region of the fin structure 10. In some embodiments, the gate structure 30 is atop the isolation region 50 on the second side of the fin structure 10. In one example, the gate structure is a gate all around (GAA) geometry, wherein a cross section of a portion of the gate structure 50 overlying the isolation region has an L-shaped geometry, as depicted in FIG. 1.

The gate structure 30 may include a gate dielectric 31 and a gate electrode 32. The gate dielectric 31 is positioned between the gate electrode 32 and the channel region of the fin structure 10. The gate dielectric 31 may be composed of any dielectric material, such as an oxide, nitride or oxynitride material. In some embodiments, the gate dielectric 31 is a high-k dielectric material. As used herein, "high-k" denotes a dielectric material featuring a dielectric constant (k) higher than the dielectric constant of $SiO_2$ at room temperature. For example, the gate dielectric layer 31 may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the gate dielectric 31 include hafnium silicate, hafnium silicon oxynitride or combinations thereof. In one embodiment, the gate dielectric 31 has a thickness ranging from about 1.0 nm to about 6.0 nm.

The gate electrode 32 may be composed of a doped semiconductor that is electrically conductive, such as n-type doped polysilicon, or the gate electrode 32 may be composed of a metal, such as a p-type work function metal layer or an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, HfSi, or combinations thereof.

As noted above, the gate structure 30 is a gate all around (GAA) geometry, wherein a cross section of a portion of the gate structure 50 overlying the isolation region has an L-shaped geometry, as depicted in FIG. 1. The vertical portion of the L-shaped geometry is in contact with the channel portion of the fin structure. The horizontal portion of the L-shaped geometry extends away from the fin structure and provides the site for electrical contact by the gate contact CB. The horizontal portion of the L-shaped geometry from the gate structure 50 provides a lateral offset of the positioning contact portion, i.e., portion electrically contacted by the gate contact CB, of the gate structure 30 from the later described second source/drain region 20 and the first source/drain region 15. This lateral offset is one design aspect that reduces the incidence of shorting between the contacts that are subsequently formed to these regions, i.e., the gate contact (CB), the first source/drain contact (bottom source/drain contact) (TS) and the second source/drain contact (top source/drain contact (CA).

Referring to FIG. 1, in some embodiments, a second source/drain region 20 is present on an upper surface of the fin structure 10. The second source/drain region 20 similar to the first source/drain region 15 may be composed of an epitaxial semiconductor material having a base composition of a type IV semiconductor, such as silicon (Si), and/or a type III-V semiconductor, such as GaAs. Therefore, the description for the base materials of the first source/drain region 15 are suitable for describing the base materials for the second source/drain region 20. The second source/drain region 20 may be composed of a same composition material as the first source/drain region 15.

The second source/drain region 20 may have a same conductivity type as the first source/drain region 15. For example, if the first source/drain region 15 is doped to an n-type conductivity, the second source/drain region 20 is also doped to an n-type conductivity. For example, if the first source/drain region 15 is doped to a p-type conductivity, the second source/drain region 20 is doped to a p-type conductivity.

Still referring to FIG. 1, a dielectric cap 21 may be present atop the second source/drain region 20. The dielectric cap 21 may be composed of any dielectric material that can protect the underlying second source/drain region 20. For example, the dielectric cap 21 may be composed of silicon nitride.

In some embodiments, the gate contact (CB) and bottom source/drain contact (TS) (first source/drain contact) are self-aligned to the dielectric cap 21, e.g., nitride containing cap, that is formed on the top of the top source/drain region (second source/drain region 20). This design feature provides for improved VFET density for a given footprint.

A sidewall spacer 25 is present on a stack of the gate structure 30 abutting the channel region of the fin structure 10, the second source/drain region 20 on the upper surface of the fin structure 10, and the dielectric cap 21 present on the second source/drain region 20. The sidewall spacer 25 is composed of a low-k dielectric. As used herein, the term "low-k" denotes a dielectric material having a dielectric constant equal to the dielectric constant of silicon oxide ($SiO_2$) or less, e.g., less that 4.0 (measured at room temperature, e.g., 25° C., and 1 atm). For example, a low-k dielectric material suitable for the sidewall spacer 25 may have a dielectric constant ranging from about 1.0 to about 3.0. Examples of low-k materials suitable for the sidewall spacer 25 include organosilicate glass (OSG), fluorine doped silicon dioxide, carbon doped silicon dioxide and combinations thereof. In one example, the sidewall spacer 25 is comprised of silicon boron carbon nitride (SiBCN), silicon oxygen carbon nitride (SiOCN), and combinations thereof. Other examples of materials suitable for the low-k dielectric material of the sidewall spacers 25 include diamond like carbon (DLC), carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

In some embodiments, the low-k sidewall spacers 25 reduce parasitic capacitance between either of the bottom source/drain contact (first source/drain contact 15) (TS) and the gate structure contact (CB) and the top source/drain region (second source/drain region 20). Further, the sidewall spacer 25 composed of the low-k dielectric material and the dielectric cap 21 atop the top source/drain region (second source/drain region 20) prevents shorting between the gate contact (CB) and the top source/drain contact (second source/drain contact) (CA). Further, the sidewall spacer 25 composed of the low-k dielectric material and the dielectric cap 20 atop the top source/drain region (second source/drain region) prevents shorting between the bottom source/drain contact (first source/drain contact) (TS) and the top source/drain contact (second source/drain contact) (CA).

Referring to FIG. 1, a first source/drain contact TS extends through an interlevel dielectric layer 40 to the first source/drain region 15, a second source/drain contact CA extends through the interlevel dielectric layer 40 to the second source/drain region 20, and a gate contact CB extends through the interlevel dielectric 40 to the gate structure 30. The sidewall spacer 25 provides for alignment of the contacts TS, CB to the first source/drain region 14 and the gate structure 30 in a manner that does not short the semiconductor device 100. The dielectric cap 21 also protects the second source/drain region 20 from being exposed and therefore shorted to either of the contacts TS, CB to the first source/drain region 14 or the gate structure 30.

The interlevel dielectric layer 40 may be composed of any dielectric material used in microelectronic and nanoelectronic structures, which can include $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H).

The contacts TS, CA, CB may be composed of any electrically conductive material, such as metals including copper (Cu), aluminum (Al), tungsten (W), platinum (Pt), titanium (Ti), silver (Ag) and combinations thereof. Some embodiments for methods for forming the structure depicted in FIG. 1 are now described with reference to FIGS. 2-12.

Figure 2:
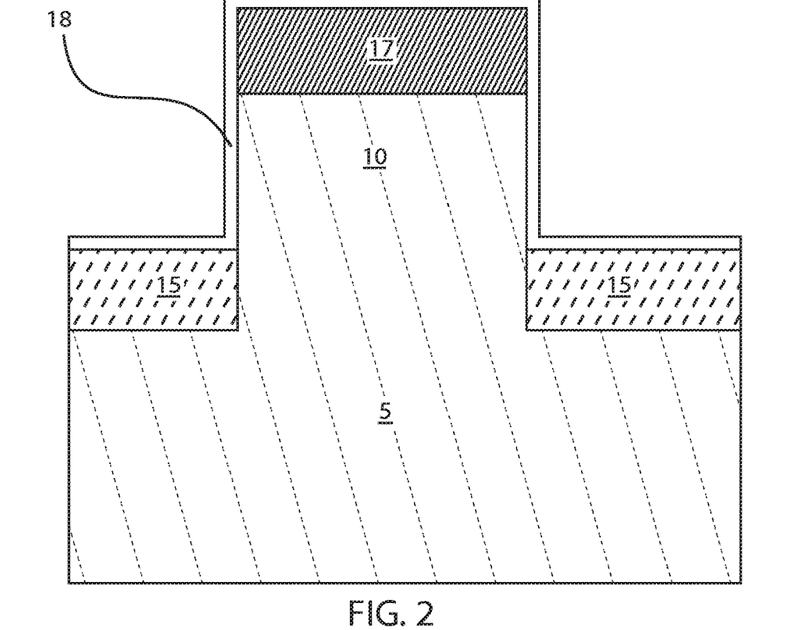
FIG. 2 is a side cross-sectional view of an initial structure that can be used in forming a vertical transistor, in which the initial structure can be provided by forming a first source/drain region in a supporting substrate abutting a fin structure. The initial structure is capped with a dielectric liner, such as oxide.

FIG. 2 depicts one embodiment of forming a first source/drain region 15 on a supporting substrate 5 abutting a fin structure 10. The fin structure 10 may be formed from the supporting substrate, e.g., bulk substrate 5, using photolithography and etch processes. Prior to etching the substrate 5 to provide the fin structures 5, a layer of the dielectric material is deposited atop the substrate 5 to provide a hardmask 17. The material layer that provides the hardmask 17 may be composed of a nitride, oxide, oxynitride material, and/or any other suitable dielectric layer. The material layer that provides the hardmask 17 can be formed by a deposition process, such as chemical vapor deposition and/or atomic layer deposition.

In one embodiment, following the formation of the layer of dielectric material that provides the hardmask 17, a photolithography and etch process sequence is applied to the material layer for the hardmask 17 to pattern the hardmask 17 in the geometry of the fin structure 10, and etch the underlying substrate 5 to form the fin structure 10. In one example, a photoresist mask is formed overlying the layer of the dielectric material that provides hardmask 17 and is present overlying the substrate 5, in which the portion of the dielectric material that is underlying the photoresist mask provides the hardmask 17, and the portion of the substrate 5 that is underlying the photoresist mask provides the fin structure 10. The exposed portions of the dielectric material layer and the substrate 5, which are not protected by the photoresist mask, are removed using a selective etch process. To provide the photoresist mask, a photoresist layer is first positioned on the layer of the dielectric material that provides the hardmask 17. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the dielectric material that provides the dielectric fin cap followed by removing the unprotected portion of the substrate 5 selective to the underlying patterned hardmask 17. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present invention include ion beam etching, plasma etching or laser ablation.

Following the formation of the fin structure 10, the first source/drain region 15 may be exposed on the recessed surfaces of the substrate 5, which were recessed by the etch process that was used to define the fin structure 10. The first source/drain region 15 may be formed using an epitaxial deposition process. For example, the epitaxial deposition process for forming the first source/drain region 15 may employ the deposition chamber of a chemical vapor deposition type apparatus, such as a PECVD apparatus. A number of different sources may be used for the epitaxial deposition of the semiconductor material of the first source/drain region 15. In some embodiments, the gas source for the deposition of an epitaxially formed first source/drain region 15 may include silicon (Si) deposited from silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

The epitaxially formed first source/drain region 15 can each be doped using ion implantation or may be doped in situ. By "in-situ" it is meant that the dopant that dictates the conductivity type of the semiconductor material of the first source/drain region 15 is introduced during the process step, e.g., epitaxial deposition, which forms the first source/drain region 15. In one embodiment, the first source/drain region 15 is doped to an n-type conductivity. The n-type gas dopant source may include arsine ($A_sH_3$), phosphine ($PH_3$) and alkylphosphines, such as with the empirical formula $R_xPH_{(3-x)}$, where R=methyl, ethyl, propyl or butyl and x=1, 2 or 3. In one embodiment, the first source/drain region 15 is doped to a p-type conductivity. A p-type dopant, such as borane and diborane gas, may be employed to in situ dope the first source/drain region 15.

Figure 3:
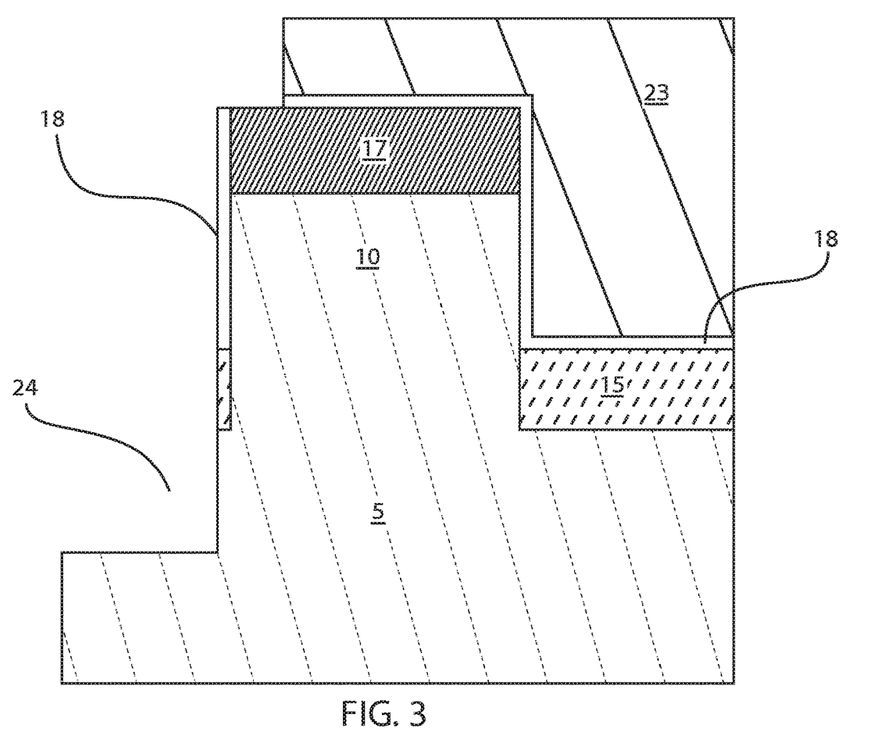
FIG. 3 is a side cross-sectional view depicting one embodiment of forming a first etch mask over at least the second side of the fin structure leaving the first side of the fin structure exposed; etching a portion of the first source/drain region present on the first side of the fin structure and underlying supporting substrate as well as a portion of the conformal oxide containing spacer atop the first source/drain region present on the first side of the fin structure to provide a trench.

Following the formation of the first source/drain region 15, a conformal oxide liner 18 is formed over the fin structure 10 and the first source/drain region 15. The conformal oxide liner 18 may be composed of silicon oxide deposited using chemical vapor deposition. The thickness of the conformal oxide liner 18 may be less than 10 nm, but not limited to only that thickness. The liner is not limited to oxides, as it can be any kind of dielectric layer, which can include $SiO_2$, $Si_3N_4$, $SiO_xN_y$, SiC, SiCO, SiCOH, and SiCH compounds, FIG. 3 depicts one embodiment of forming a first etch mask 23 over at least the first side of the fin structure 10 leaving the second side of the fin structure 10 exposed; etching a portion of the first source/drain region 15 present on the second side of the fin structure and underlying supporting substrate 5 as well as a portion of the conformal oxide containing liner 19 atop the first source/drain region 15 present on the second side of the fin structure 10 to provide a trench 24. The first etch mask 23 may be composed of an organic planarization layer (OPL) layer. The organic planarization layer 23 may be composed of an organic polymer that may include polyacrylate resin, epoxy resin, phenol resin, polyamide resin, polyimide resin, unsaturated polyester resin, polyphenylenether resin, polyphenylenesulfide resin, or benzocyclobutene (BCB). In some embodiments, the organic planarization layer (OPL) is deposited from solution, e.g., by spin on deposition, and is baked at high temperature. The OPL, layer nay be patterned and etched to provide the first etch mask 23 using photolithography, development, and etching processes similar to those described above for defining the dimensions of the patterned hardmask 17 and the fin structure 10. The first etch mask 23 provided by the patterned OPL layer exposes the second side of the fin structure 10, while the first etch mask 23 protects the first side of the fin structure 10.

The patterned OPL layer that provides the first etch mask 23 can be employed in forming the trench 24 on the second side of the fin structure 10. The pattern here has large tolerance (~fin length) for alignment as long as the bottom trench etching before epi has high selectivity over the hardmask The trench 24 can be etched through the portion of the semiconductor material deposited for the first source/drain region 15 on the second side of the fin structure 10 into the supporting substrate 5 using an anisotropic etch, such as reactive ion etch (RIE). The anisotropic etch for forming the trench 24 also removes the portion of the conformal oxide liner 19 that is present atop the semiconductor material deposited for the first source/drain region 15 on the second side of the fin structure 10. The remaining portion of the conformal oxide liner 19 protects the fin structure 10 during the etch process for forming the trench 24. In some embodiments, a thin remaining portion of the semiconductor material deposited for the first source/drain region 15 may remain on the second side of the fin structure 10 between the trench 24 and the sidewall of the fin structure 10. During the etch process for forming the trench 24, the first etch mask 23 protects the first source/drain region 15 on the first side of the fin structure 10. Following forming the trench 24, the first etch mask 23, as well as the remaining portion of the conformal oxide liner 18 is removed.

Figure 4:
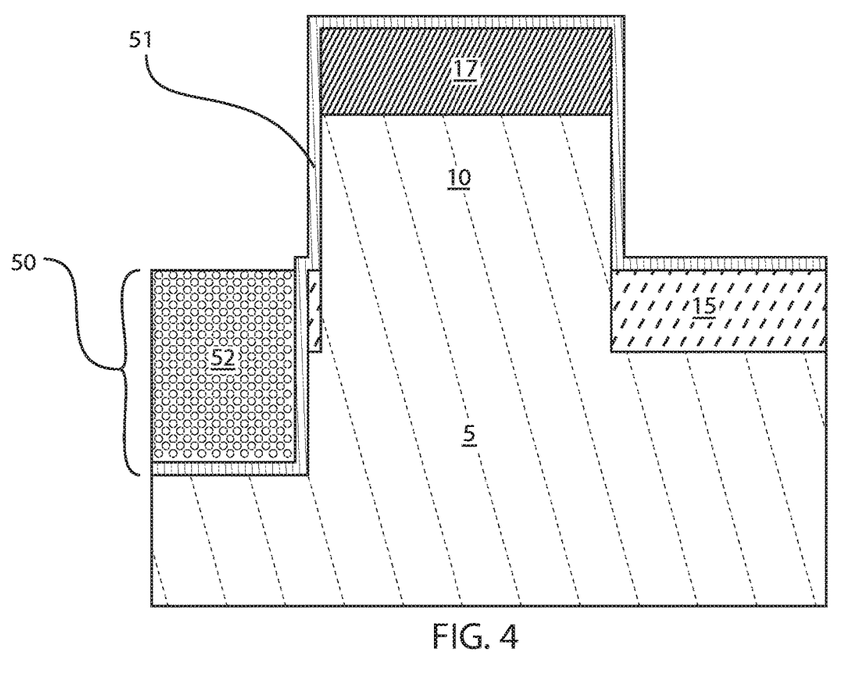
FIG. 4 is a side cross-sectional view depicting one embodiment of forming an isolation region in the trench that is depicted in FIG. 3 with a deposited liner (such as SiN) over the entire wafer, which extends into the supporting substrate adjacent to the second side of the fin structure, wherein the first source/drain region is positioned on an opposing first side of the fin structure.

FIG. 4 depicts one embodiment of forming an isolation region 50 in the trench 24 that is depicted in FIG. 3, which extends into the supporting substrate 5 adjacent to the second side of the fin structure 10, wherein the first source/drain region 15 is positioned on an opposing first side of the fin structure 10. Forming the isolation region 50 may include the blanket deposition of the conformal dielectric liner layer 51, such as a nitride containing liner, e.g., silicon nitride liner, which includes a portion of the conformal dielectric liner layer 51 being deposited on the sidewalls and base of the trench 24. The conformal dielectric liner layer 51 may be deposited using a chemical vapor deposition (CVD) process. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

Following the formation of the conformal dielectric liner layer 51, the trench 24 may be filled with a dielectric fill 52 forming the isolation region 40. The dielectric fill 52 may also be formed using a chemical vapor deposition (CVD) process, such as Atmospheric Pressure CVD (APCVD), Low Pressure CVD (LPCVD) and Plasma Enhanced CVD (PECVD), Metal-Organic CVD (MOCVD) and combinations thereof. To localize the deposition of the material for the dielectric fill 52 to the trench 24, a block mask (not shown), such as a photoresist block mask, may be employed. The height of the dielectric fill 52 can be controlled using timed deposition and/or etch back processing.

Figure 5:
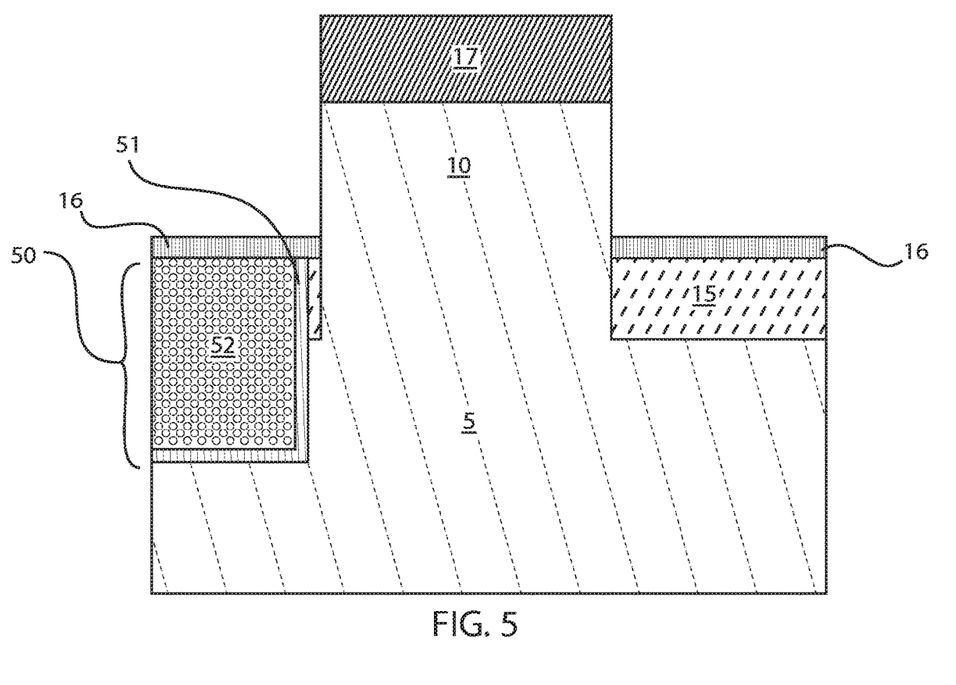
FIG. 5 is a side cross-sectional view depicting one embodiment of forming at least one dielectric isolating spacer on the isolation region and the first source/drain region.

FIG. 5 depicts one embodiment of forming at least one dielectric isolating spacer 16 on the isolation region 50 and the first source/drain region 15. Before depositing the material layer for the dielectric isolating spacer 16, the portions of the conformal dielectric liner layer 51 that extend from the trench 24 may be removed using a selective etch process. The dielectric isolating spacer 16 may be formed using a deposition process, such as chemical vapor deposition. One example of a directional deposition process for forming the dielectric isolating spacer 16 is high density plasma chemical vapor deposition.

Figure 6:
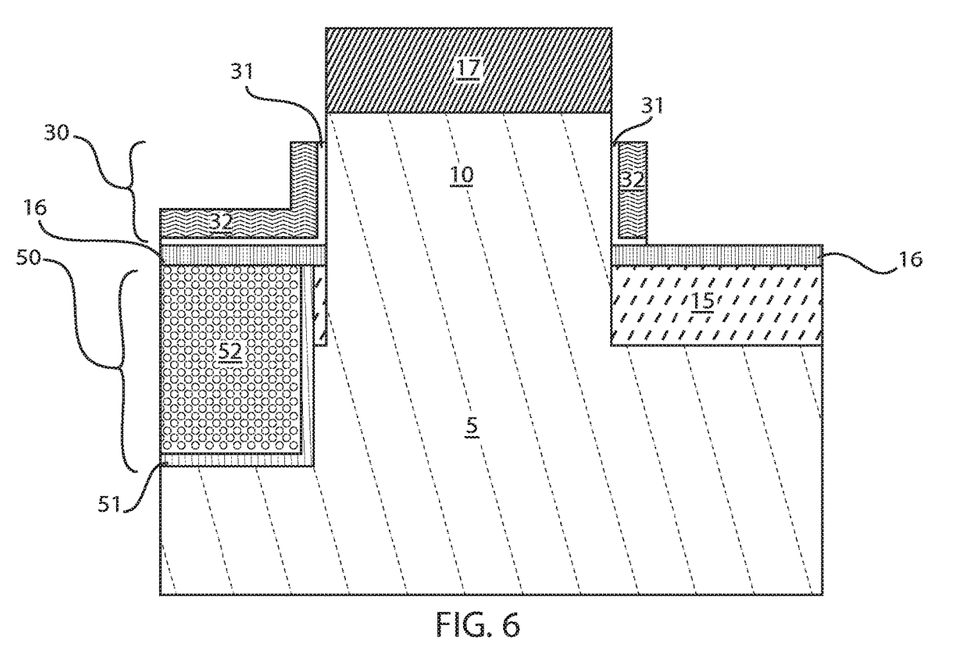
FIG. 6 is a side cross-sectional view depicting one embodiment of forming a gate structure on the structure depicted in FIG. 5.

FIG. 6 depicts one embodiment of forming a gate structure 30 on the structure depicted in FIG. 5. The gate dielectric 31 of the gate structure 30 may be deposited using chemical vapor deposition methods, such as plasma enhanced chemical vapor deposition (PECVD, or atomic layer deposition (ALD). The material layer for the gate conductor 32 may be deposited by CVD, e.g., plasma enhanced chemical vapor deposition (PECVD), or physical vapor deposition (PVD), such as sputtering, or plating, such as electroplating, electroless deposition, and combinations thereof. Following deposition of the material layer for the gate conductor 32, an etch process, such as reactive ion etch (RIE), employed with etch masks may provide the geometry of the gate structure 30.

Figure 7:
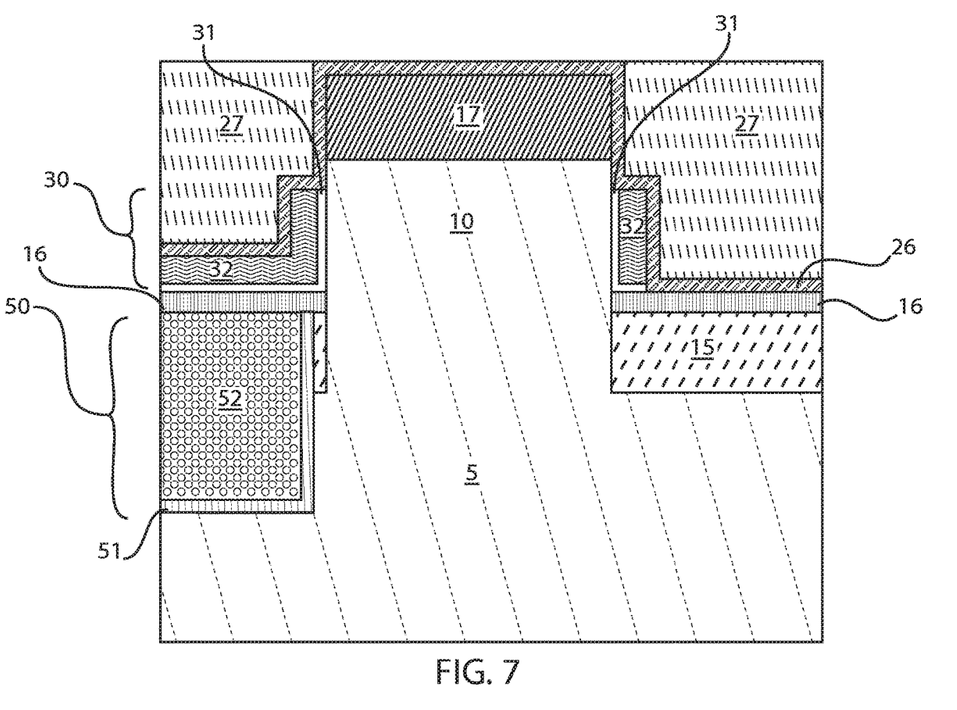
FIG. 7 is a side cross-sectional view depicting depositing a gate encapsulating nitride containing dielectric liner on the structure depicted in FIG. 6, and depositing an oxide containing sacrificial material on the gate encapsulating nitride containing dielectric layer.

FIG. 7 depicts depositing a gate encapsulating nitride containing dielectric liner 26 on the structure depicted in FIG. 6, and depositing an oxide containing sacrificial material 27 on the gate encapsulating nitride containing dielectric layer 26. In one embodiment, the gate encapsulating nitride containing dielectric liner 26 may be a conformally deposited layer formed using chemical vapor deposition, and being composed of silicon nitride. The oxide containing sacrificial material 27 may be composed of silicon oxide deposited using chemical vapor deposition or spin on deposition.

Figure 8:
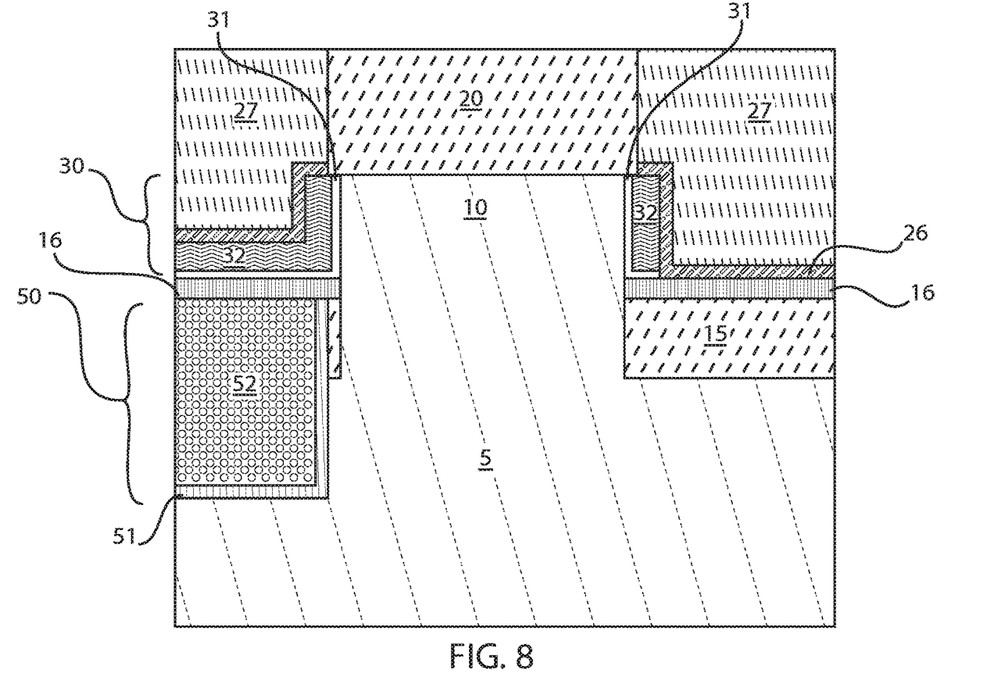
FIG. 8 is a side cross-sectional view depicting forming a second source/drain region on the upper surface of the fin structure.

FIG. 8 depicts forming a second source/drain region 20 on the upper surface of the fin structure 10. In some embodiments, forming the second source/drain region 20 on the upper surface of the fin structure 10 includes removing the hard mask 17 with an etch that is selective to the oxide containing sacrificial material 27 to expose the upper surface of the fin structure 10; and epitaxially forming the second source/drain region 20 on an exposed surface of the upper surface of the fin structure 10. The epitaxial forming method may include in situ doping to provide the conductivity type of the second source/drain region 20. Further details regarding epitaxial growth and in situ doping are provided in the above description of forming the first source/drain region.

Figure 9:
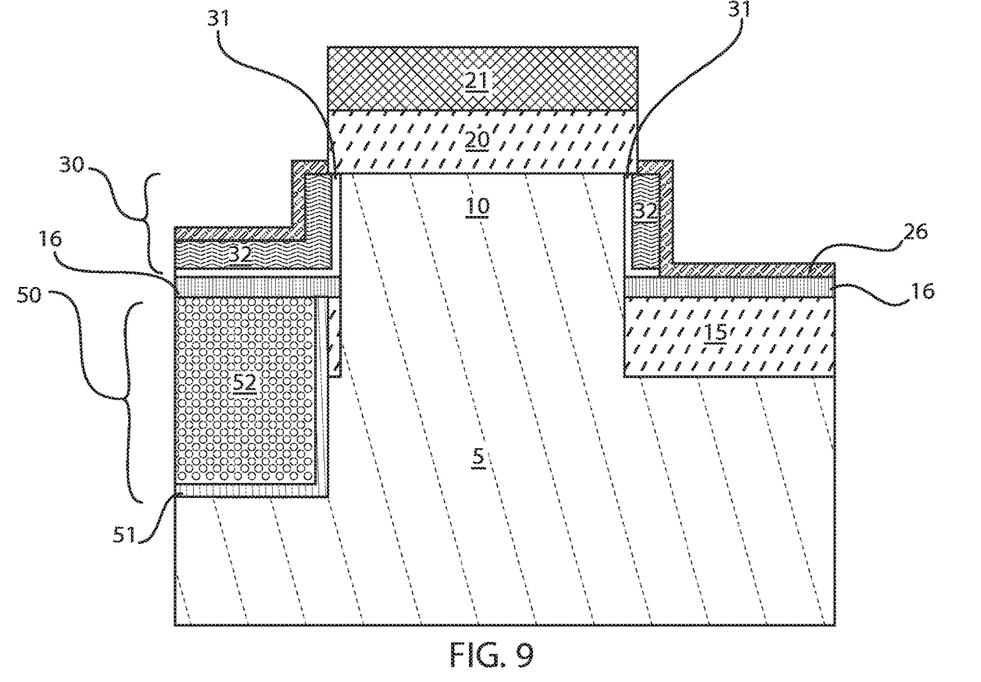
FIG. 9 is a side cross-sectional view depicting forming a dielectric cap on the second source/drain region and then removing the oxide containing sacrificial material.

FIG. 9 depicts forming a dielectric cap 21 on the second source/drain region 20. Forming the dielectric cap 21 may begin with recessing the second source/drain region 20 using an etch that is selective to the oxide containing sacrificial material 27. Thereafter, the dielectric cap 21 may be deposited on the recessed upper surface of the second source/drain region 20 using a deposition process, such as chemical vapor deposition (CVD), followed by planarization to provide that the upper surface of the dielectric cap 21 is coplanar with the upper surface of the oxide containing sacrificial material 27. Then the oxide containing sacrificial material 27 depicting in FIG. 8 is removed. In some embodiments, the oxide containing sacrificial material 27 is removed by an etch that is selective to the gate encapsulating nitride containing dielectric liner 26 and the dielectric cap 21.

Figure 10:
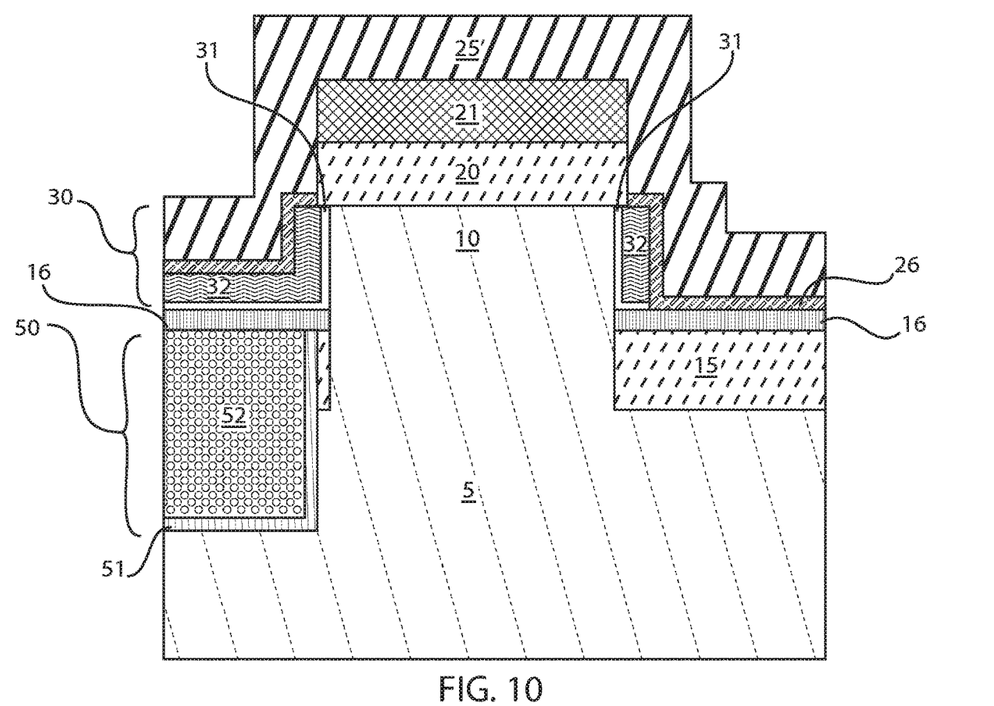
FIG. 10 is a side cross-sectional view depicting one embodiment of forming a conformal dielectric capping layer of a low-k dielectric material for forming sidewall spacers.

FIG. 10 depicts one embodiment of forming a conformal dielectric capping layer 25' of a low-k dielectric material for forming sidewall spacers 25.

Forming the conformal dielectric capping layer 25' includes a deposition process. Deposition for the purposes of forming the conformal dielectric capping layer 25' is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 11:
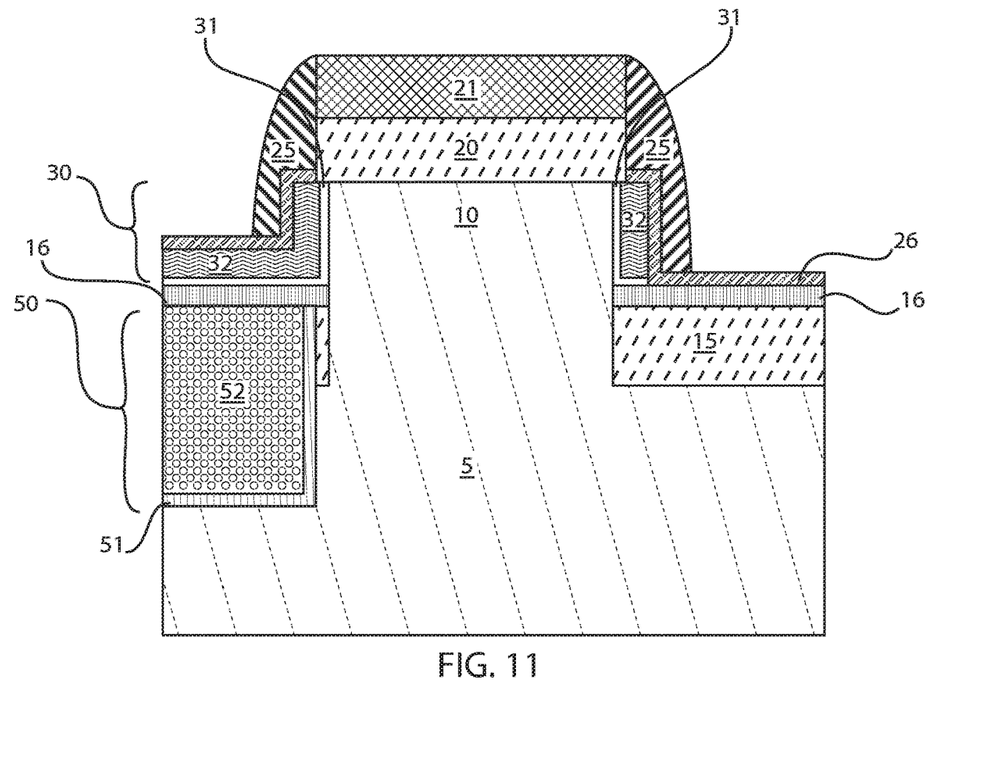
FIG. 11 is a side cross-sectional view depicting etching the conformal dielectric capping layer of the low-k dielectric material to form sidewall spacers on a stack of the gate structure abutting the channel region of the fin structure, the second source/drain region on the upper surface of the fin structure, and the low-k dielectric cap is deposited on the second source/drain region.

FIG. 11 depicts etching the conformal dielectric capping layer 25' of the low-k dielectric material to form sidewall spacers 25 on a stack of the gate structure 30 abutting the channel region of the fin structure 10, the second source/drain region 20 on the upper surface of the fin structure, and the dielectric cap 21 present on the second source/drain region 20. Etching the conformal dielectric capping layer 25' of the low-k dielectric material to form the sidewall spacers 25 may include an etch back process, such as an anisotropic etch, e.g., reactive ion etching (RIE) and/or laser etching. The thickness of the conformal dielectric capping layer 25', and the parameters of the etch back process are selected to provide a width of the sidewall spacers 25 that encapsulates the sidewalls of the second source/drain region 20, encapsulates the portion of gate structure 30 on the first side of the fin structure 30, and covers the vertically orientated portion of the gate structure 20 on the second side of the fin structure 30. This provides that the sidewall spacers 25 protects these elements during the selective etch processes that provides the openings for the various contacts TS, CA, CB to the device 100, and therefore substantially eliminates the likelihood of device shorting.

Figure 12:
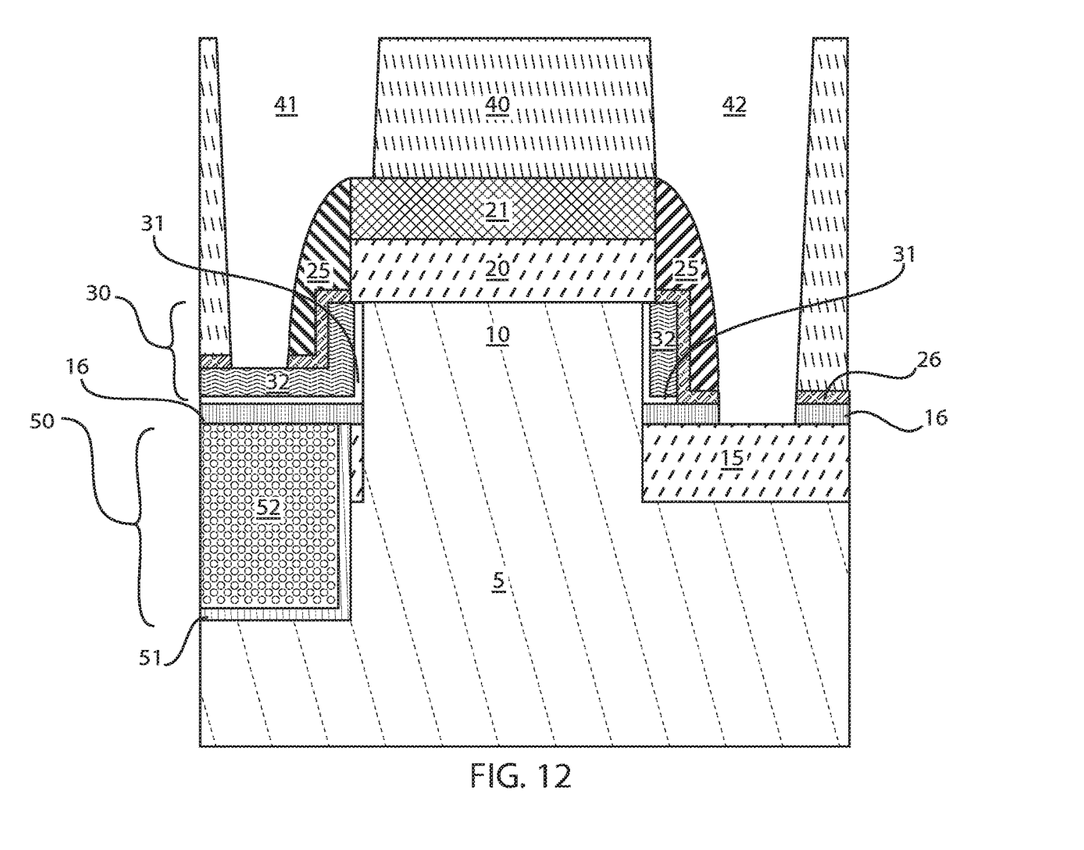
FIG. 12 is a side cross-sectional view depicting depositing an interlevel dielectric layer and patterning a gate contact opening, and a first source/drain opening through the interlevel dielectric layer, wherein the gate contact opening and the first source/drain opening are self-aligned to the sidewall spacer composed of the low-k dielectric material.

FIG. 12 depicts depositing an interlevel low-k dielectric layer 40 and patterning a gate contact opening 41, and a first source/drain opening 42 through the interlevel dielectric layer 40, wherein the gate contact opening 41 and the first source/drain opening 42 are self-aligned to the sidewall spacer 25 composed of the low-k dielectric material. The interlevel dielectric layer 70 may be deposited using chemical vapor deposition, deposition from solution, spin on deposition and combinations thereof. Following deposition, a planarization process may be applied to the upper surface of the interlevel dielectric layer 70. The gate contact opening 41 and the first source/drain opening 42 are formed through the interlevel dielectric layer using deposition, photolithography and etch processes. A second source/drain contact opening may then be formed to the second source/drain region 20. The openings may be filled with a metal, as depicted in FIG. 1. Examples of processes suitable for depositing the metal for the contacts CB, CA and TS can include plating, electroplating, electroless plating, sputtering and combinations thereof.

The sidewall spacer 25 composed of the low-k dielectric material and the dielectric cap 21 atop the top source/drain region (second source/drain region 20) prevents shorting between the gate contact (CB) that is to be formed in the gate contact opening 41 and the top source/drain contact (second source/drain contact) (CA). Further, the sidewall spacer 25 composed of the low-k dielectric material and the dielectric cap 21 atop the top source/drain region (second source/drain region 20) prevents shorting between the bottom source/drain contact (first source/drain contact) (TS) and the top source/drain contact (second source/drain contact) (CA). As illustrated, even with the first source/drain contact (TS) and the gate contact (CB) overlaying the second source/drain region 20, the sidewall spacer 25 prevent shorting between these contacts TS, CB and the second source/drain region 20, hence providing for both increased scaling and high yield.

Having described preferred embodiments of a structure and method for forming vertical field effect transistor with self-aligned contacts, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device comprising:
a fin structure having planar sidewalls atop a supporting substrate;
a first source/drain region present on a portion of the supporting substrate on a first side of the planar sidewalls of the fin structure, the first source/drain region being laterally offset from the fin structure to provide that no portion of the first source/drain region is directly under the fin structure;
an isolation region present on a second side of the planar sidewalls of the fin structure, the isolation region abutting a lower portion of the fin structure;
a gate structure abutting a channel region of the planar sidewalls of the fin structure, the channel region atop the lower portion of the fin structure that is butting the first source/drain region, and the gate structure being atop the isolation region on the second side of the fin structure, wherein the gate structure includes a gate dielectric and a gate electrode each comprised of material layers having a conformal thickness and an L-shaped geometry when viewed from a side view on a side of the fin structure having a gate contact, the L-shaped geometry including a laterally orientated portion and a vertically orientated portion for each of said material layers for the gate dielectric and the gate electrode;
a sidewall spacer having an inside surface in direct contact with a sidewall of a second source/drain region, wherein a portion of the sidewall spacer encapsulates the vertically orientated portion for said each of said material layers for the gate dielectric and the gate electrode; and
a contact to the first source/drain region, wherein the contact is in direct contact with an outside surface of the spacer.

2. The semiconductor device of claim 1, wherein the isolation region is a shallow trench isolation region (STI) that extends into the supporting substrate and includes a conformal dielectric liner layer, and a dielectric fill.

3. The semiconductor device of claim 1, wherein the fin structure comprises a type IV semiconductor, a type III-V semiconductor or a combination thereof.

4. The semiconductor device of claim 1, wherein the gate structure is separated from the isolation region and the first source/drain region by a dielectric spacer.

5. The semiconductor device of claim 1, wherein the gate structure is a gate all around geometry, wherein a cross section of a portion of the gate structure overlaying the isolation region has an L-shaped geometry.

6. The semiconductor device of claim 5, wherein a dielectric cap is present on the second source/drain region that is present on an upper surface of the fin structure.

7. The semiconductor device of claim 1, wherein the sidewall spacer is comprised of a low-k dielectric material selected from the group consisting of SiBCN, SiOCN, and combinations thereof.

8. A semiconductor device comprising:
a fin structure having planar sidewalls atop a supporting substrate;
a first source/drain region present on a portion of the supporting substrate on a first side of the planar sidewalls of the fin structure, the first source/drain region being laterally offset from the fin structure to provide that no portion of the first source/drain region is directly under the fin structure;
an isolation region present on a second side of the planar sidewalls of the fin structure, the isolation region abutting a lower portion of the fin structure, wherein an inner sidewall of the isolation region is substantially aligned with a sidewall of the fin structure on said second side of the fin structure;
a gate structure abutting a channel region of the planar sidewalls of the fin structure, the channel region atop the lower portion of the fin structure that is butting the first source/drain region, and the gate structure being atop the isolation region on the second side of the fin structure, wherein the gate structure includes a gate dielectric and a gate electrode each comprised of material layers having a conformal thickness and an L-shaped geometry when viewed from a side view on a side of the fin structure having a gate contact, the L-shaped geometry including a laterally orientated portion and a vertically orientated portion for each of said material layers for the gate dielectric and the gate electrode;
a sidewall spacer is present on a stack of the gate structure abutting the channel region of the fin structure, a second source/drain region on the upper surface of the fin structure, and a dielectric cap present on the second source/drain region, wherein the sidewall spacer has an inside surface in direct contact with a sidewall of the second source/drain region, wherein a portion of the sidewall spacer encapsulates the vertically orientated portion for said each of said material layers for the gate dielectric and the gate electrode; and
contacts to the first source/drain region and the second source/drain region, wherein the sidewall spacer provides for alignment of the contacts to the first source/drain region and the gate structure in a manner that does not short the semiconductor device, wherein the contract is in direct contact with an outside surface of the spacer.

* * * * *